United States Patent [19]

Scifres et al.

[11] 4,280,108

[45] Jul. 21, 1981

[54] TRANSVERSE JUNCTION ARRAY LASER

[75] Inventors: Donald R. Scifres, Los Altos; Robert D. Burnham, Los Altos Hills; William Streifer, Palo Alto, all of Calif.

[73] Assignee: Xerox Corporation, Stamford, Conn.

[21] Appl. No.: 57,159

[22] Filed: Jul. 12, 1979

[51] Int. Cl.$^3$ .............................................. H01S 3/19
[52] U.S. Cl. ................................. 331/94.5 H; 357/17
[58] Field of Search .................... 331/94.5 H; 357/18, 357/17

[56] References Cited

U.S. PATENT DOCUMENTS

| 3,983,509 | 9/1976 | Scifres et al. ................... 331/94.5 H |
| 4,166,278 | 8/1979 | Susaki et al. ..................... 331/94.5 H |

*Primary Examiner*—James W. Davie
*Attorney, Agent, or Firm*—Leonard Zalman

[57] ABSTRACT

A laser array comprised of a plurality of stacked emitting or active regions which are in sufficiently close contact to each other that light from each active region is coupled to the light from the adjacent active regions to form a phase-locked laser array with low composite beam divergence perpendicular to the plane of the rectifying junction of the active regions.

7 Claims, 3 Drawing Figures

TRANSVERSE JUNCTION ARRAY LASER

The invention relates to a laser array in which several lasers which are stacked perpendicular to the junction plane are optically coupled and therefore phase locked so that a low divergence far-field beam perpendicular to the junction plane is formed.

BACKGROUND OF THE INVENTION

Semiconductor injection lasers generally exhibit far field beam divergences of about 10° along the plane of the p-n junction and about 50° perpendicular to the plane of the p-n junction. It is desirable to produce a semiconductor laser with a beam divergence of about 10°×10° because this lower beam divergence reduces the cost of the collection optics in a system such as a video disk recorder or increases the amount of light which can be launched into a fiber optic system. Thus, for many applications it is necessary that the far-field radiation pattern of a high-power laser not be excessively divergent. Recently, a phase-locked laser array was disclosed (Appl. Phys. Lett. 33-12-1015) in which a plurality of lasers in the plane of the p-n junction were optically coupled together to achieve a high-power laser with low beam divergence (less than 2 degrees) in the plane of the p-n junction. To data, a high power laser with low beam divergence perpendicular to the plane of the p-n junction has not been reported.

SUMMARY OF THE INVENTION

The invention as claimed is intended to solve the need for a high-power laser with low beam divergence perpendicular to the plane of the p-n junction of the laser. The laser is in fact a laser array in which a plurality of laser emitting or active regions are in sufficiently close contact with each other that light from each active region is coupled to the light from the adjacent active regions to form a phase-locked laser array. Such an array provides low composite beam divergence perpendicular to the plane of the p-n junction due to phase-locked constructive interference as described in the referenced publication. In addition to its low beam divergence aspect, the laser array can have a configuration that provides effective heat sinking for all active regions by way of one of the biasing electrodes.

BRIEF DESCRIPTION OF THE DRAWINGS

Specific embodiments of the invention are described hereafter in relation to the following drawings in which.

DETAILED DESCRIPTION OF THE INVENTION

Figure 1:
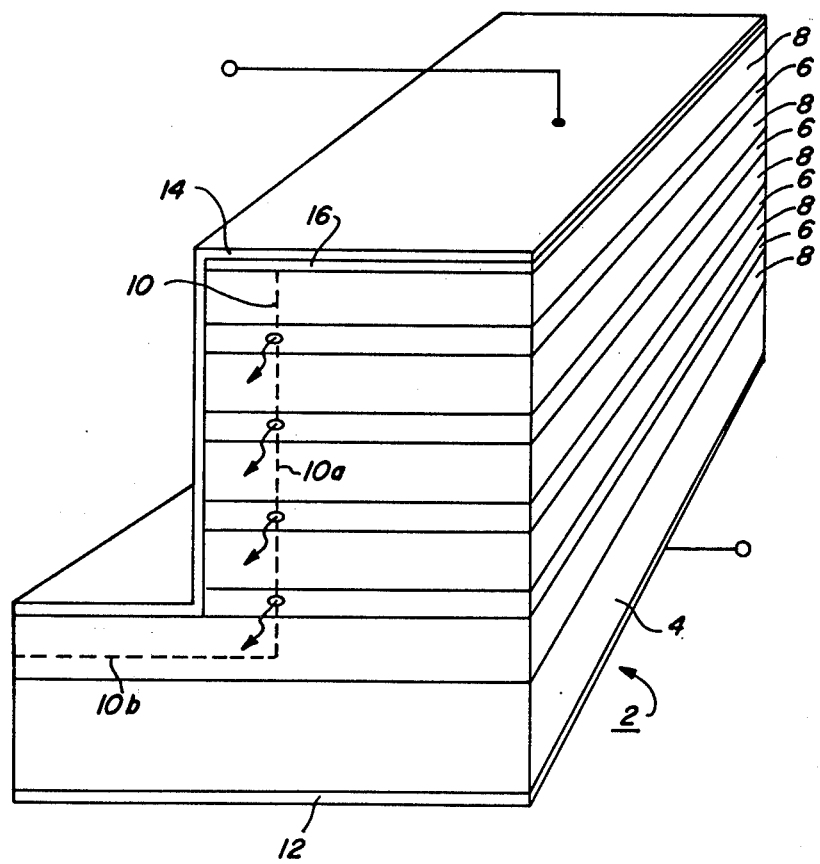
FIG. 1 is a perspective view of one embodiment of a phase-locked laser array in accordance with the invention.

Referring first to FIG. 1, there is shown a laser array 2 including a substrate 4 which supports a plurality of emitting regions or layers 6 each of which is sandwiched between a pair of waveguiding and carrier confining layers 8. Specifically, substrate 4 and layers 6 can be GaAs and layers 8 can be $Ga_{0.7}Al_{0.3}As$, although other materials are contemplated provided that layers 8 are of a material having a higher band gap than that of the material of layers 6.

A rectifying junction 10 has a portion 10a perpendicular to emitting layers 6 and a portion 10b parallel to emitting layers 6. Rectifying junction portion 10a is close (on the order of 3 um) to the left side of emitting layers 6 and can be formed by having the material to the left of the junction p-type and the material to the right of the junction n-type, although the reverse doping could be used. A contact 12 is provided to substrate 4, and another step-shaped contact 14 is provided such that it contacts the left side of the emitting layers 6 and the bottom waveguiding and carrier confining layer 8. A layer of insulating material 16 prevents contact 14 from shorting junction 10. The near and far faces of layers 6 are cleaved or mirrored to provide a plurality of stacked resonant cavities.

Laser operation in initiated in each of the emitting layers 6 upon forward biasing of p-n junction 10 beyond threshold, i.e., a sufficiently more positive voltage on electrode 14 than on electrode 12 when the material to the left of junction 10 is p-type. In accordance with the invention, emitting layers 6 are in sufficiently close proximity to each other that light from one emitting layer 6 couples to the adjacent emitting layer or layers to form a phase-locked laser array, that is, there is phase-locked constructive interference between the light emitted from adjacent layers 6. Sufficient emitter layer proximity for phase-locking is achieved, for example, by a structure in which layers 6 are on the order of 0.1 um to 0.3 um, and layers 8 are on the order of 1 um or less. The phase-locking provides a composite output light beam having a low divergence perpendicular to the plane of junction portion 10a.

Laser 2 can be formed by growing on n-type substrate 4 alternate layers 8 and 6 of n-type GaAlAs and GaAs, respectively, to the thickness ranges specified; such growth can be accomplished by conventional liquid phase epitaxy, vapor phase epitaxy or molecular beam epitaxy, or equivalent growth methods. During such growth, care must be taken to ensure that each layer 6 is of the same composition and thickness since each layer 6 is a light emitting layer. Next, the layered structure is covered with an insulating layer such as silicon nitride which can also serve as a diffusion mask. By photolithographic techniques and chemical or plasma etching the insulating layer is removed on all but a portion of the right face of the layered structure. Next, by treating the layered structure with a chemical etchant, such as $H_2O_2+H_2SO_4+H_2O+HF$, a portion of the exposed left face of the layered structure is removed to provide the step-shaped structure of FIG. 1. A diffusion is then performed in a conventional manner with an impurity, such as zinc, which diffuses into the layered structure to form p-n junction 10. Next, the wafer may be thinned by chemical polishing and then electrodes 12 and 14 of Sn/Au/In and Cr/Au/In, for example, may be applied to the layered structure, with cleaving or mirroring of the near and far faces of the layered structure also being accomplished to provide the laser 2.

As shown in FIG. 1, electrode 14 extends along the etched region of the laser, crossing all the emitting layers 6. Thus, electrode 14 and any heat sink structure attached thereto will effectively help to prevent overheating of the laser structure 2.

Figure 2:
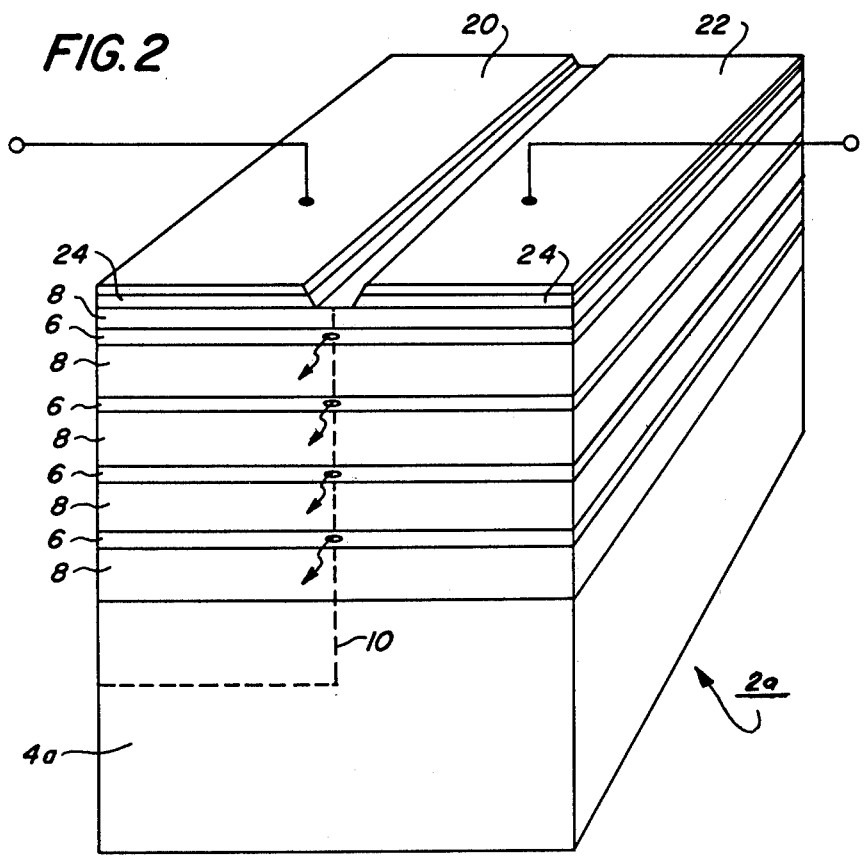
FIG. 2 is a perspective view of a second embodiment of a phase-locked laser array in accordance with the invention.

FIG. 2 depicts a second embodiment of a laser array 2a, in which components having compositions and thicknesses corresponding to those of the embodiment of FIG. 1 have the same reference numerals as the FIG. 1 embodiment. Substrate 4a can be semi-insulating GaAs. Laser 2a is not etched, but appropriate masking and an impurity diffusion are carried out to provide rectifying junction 10. Electrodes 20 and 22 are provided on opposite sides of junction 10 by contact facilitating layers 24, for example, of highly doped GaAs, to provide forward biasing of junction 10 and phase-locked emission by the emitting layers 6.

It should be noted that although this invention is described as relating to GaAs and GaAlAs, any semiconductive materials capable of laser emission, such as those containing In, Ga, Al, As, P, Sb, Pb, Sn, Te, or others, can be used.

Figure 3:
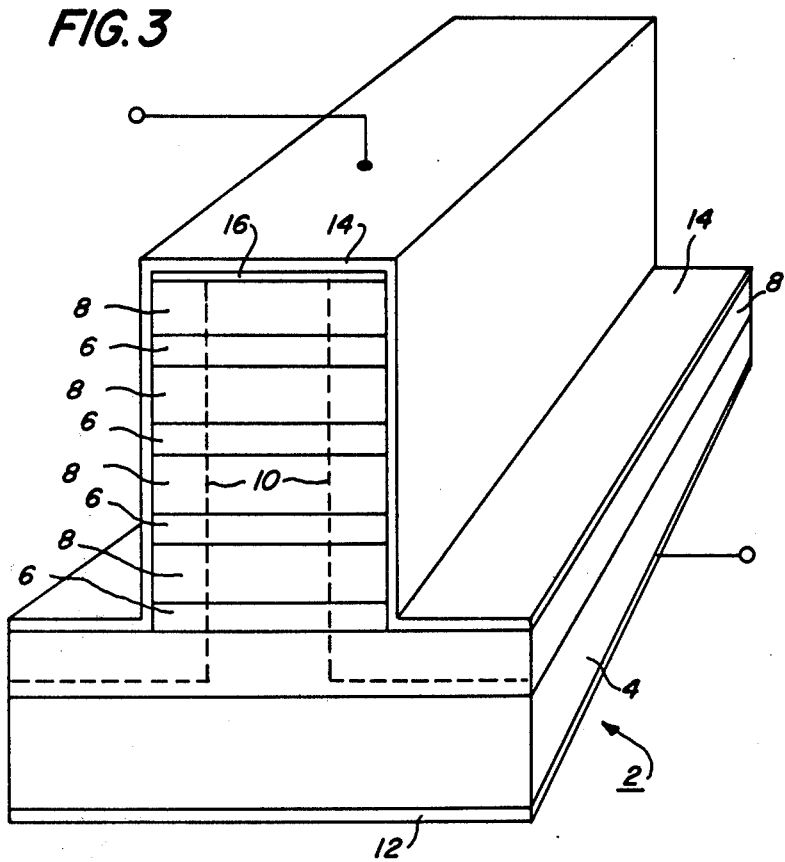
FIG. 3 is a perspective view of a third embodiment of a phase-locked laser array in accordance with the invention.

It is apparent that a two dimensional array of coherent laser spots can be formed by appropriate diffusion, masking or chemical etching techniques. Thus, rather than having a single p-n junction as depicted in FIGS. 1 and 2 one might create two or more of these vertical p-n junctions to form an area array, as shown in FIG. 3 in which components corresponding to like components of FIG. 1 have the same reference numerals. Such a 2-deminsional array could be capable of extremely high peak output power while providing low beam divergence in both emission directions.

What is claimed is:

1. A solid state light emitting device comprising:
 a semiconductor body including a plurality of active region layers;
 each of said active region layers being sandwiched between semiconductor material having a bandgap higher than the bandgap of the material of that active region layer;
 a rectifying junction within said semiconductor body, at least a portion of said rectifying junction traversing said active region layers;
 resonator means for providing a plurality of optical resonant cavities each of which includes one of said active region layers; and
 electrode means for the application of forward bias to said rectifying junction to provide pump current to said active region layers whereby, upon sufficient forward bias, each of said active region layers emits a light beam.

2. A solid state light emitting device comprising:
 a semiconductor body including a plurality of substantially planar active region layers;
 each of said active region layers being sandwiched between semiconductor material having a bandgap higher than the bandgap of the material of that active region layer;
 a rectifying junction within said semiconductor body, at least a portion of said rectifying junction traversing said active region layers in a direction transverse to the planar direction of said active region layers;
 resonator means for providing a plurality of optical resonant cavities each of which includes one of said active region layers; and
 electrode means for the application of forward bias to said rectifying junction to provide pump current to said active region layers whereby, upon sufficient forward bias, each of said active region layers emits a light beam having a propogation direction parallel to the planar direction of that active region layer.

3. A solid state light emitting device comprising:
 a semiconductor body including a plurality of substantially planar active region layers;
 each of said active region layers being sandwiched between semiconductor material having a bandgap higher than the bandgap of the material of that active region layer, adjacent pairs of said active region layers being separated by a distance substantially greater than the thickness of any of said active region layers;
 a rectifying junction within said semiconductor body, at least a portion of said rectifying junction traversing said active region layers in a direction transverse to the planar direction of said active region layers;
 resonator means for providing a plurality of optical resonant cavities each of which includes one of said active region layers; and
 electrode means for the application of forward bias to said rectifying junction to provide pump current to said active region layers whereby, upon sufficient forward bias, each of said active region layers emits a light beam having a propogation direction parallel to the planar direction of that active region layer.

4. A solid state light emitting device comprising:
 a semiconductor body including a plurality of substantially planar active region layers;
 each of said active region layers being sandwiched between semiconductor material having a bandgap higher than the bandgap of the material of that active region layer;
 a rectifying junction within said semiconductor body, at least a portion of said rectifying junction traversing said active region layers in a direction transverse to the planar direction of said active region layers;
 resonator means for providing a plurality of optical resonant cavities each of which includes one of said active region layers; and
 electrode means for the application of forward bias to said rectifying junction to provide pump current to said active region layers whereby, upon sufficient forward bias, each of said active region layers emits a light beam having a propogation direction parallel to the planar direction of that active region layer;
 said active region layers being in sufficiently close proximity to each other that the light beams emitted from adjacent active region layers are phase locked.

5. A solid state light emitting device comprising:
 a semiconductor body including a substrate, a plurality of substantially planar active region layers of a first material, and a plurality of other layers of a second material having a bandgap higher than the bandgap of said first material;
 adjacent pairs of said active region layers being separated by one of said plurality of other layers;
 a rectifying junction within said semiconductor body, at least a portion of said rectifying junction traversing said active region layers in a direction transverse to the planar direction of said active region layers;
 resonator means for providing a plurality of optical resonant cavities each of which includes one of said active region layers; and
 electrode means for the application of forward bias to said rectifying junction to provide pump current to said active region layers whereby, upon sufficient forward bias, each of said active region layers emits a light beam having a propogation direction parallel to the planar direction of that active region layer;

said active region layers being in sufficiently close proximity to each other that the emitted light beams are phase locked.

6. A solid state device for producing a composite output beam of low divergence comprising:
- a semiconductor body including a substrate, a plurality of substantially planar laser active region layers, and a plurality of other substantially planar semiconductor layers each of which is of a material having a bandgap higher than that of the material of any of said active region layers;
- at least some of said active region layers being sandwiched between different pairs of said other semiconductor layers;
- a rectifying junction within said semiconductor body, at least a portion of said rectifying junction traversing said active region layers in a direction transverse to the planar direction of said active region layers;
- resonator means for providing a plurality of optical resonant cavity each of which includes one of said active region layers; and
- electrode means for the application of forward bias to said rectifying junction to provide pump current to said active region layers whereby, upon sufficient forward bias, each of said active region layers emits a light beam having a propogation direction parallel to the planar direction of that active region layer;
- said active region layers being in sufficiently close proximity to each other that the light beams emitted from adjacent active region layers are phase-locked to thereby provide a composite output light beam having a low divergence.

7. The light emitting device of claim 6 in which heat conducting means are in close proximity to at least a portion of said portion of said rectifying junction.

* * * * *